US006989302B2

(12) United States Patent
Makovicka et al.

(10) Patent No.: US 6,989,302 B2
(45) Date of Patent: Jan. 24, 2006

(54) METHOD FOR FABRICATING A P-TYPE SHALLOW JUNCTION USING DIATOMIC ARSENIC (75) Inventors: Tim J. Makovicka, McKinney, TX (US); Alan L. Kordick, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 182 days.

(21) Appl. No.: 10/429,796

(22) Filed: May 5, 2003

(65) Prior Publication Data

US 2004/0224470 A1 Nov. 11, 2004

(51) Int. Cl.
*H01L 21/8243* (2006.01)

(52) U.S. Cl. ............... 438/199; 438/223; 438/229; 438/213

(58) Field of Classification Search ............... 438/199, 438/223, 224, 229, 213, 227, 228, 231, 232; 257/199, 371, 378, 509
See application file for complete search history.

(56) References Cited

U.S. PATENT DOCUMENTS

| | | | |
|---|---|---|---|
| 6,180,470 | B1 | 1/2001 | Aronowitz et al. |
| 6,265,255 | B1 * | 7/2001 | Hsien ............... 438/199 |
| 6,372,566 | B1 | 4/2002 | Kittl et al. |
| 6,429,054 | B1 | 8/2002 | Krishnan et al. |

OTHER PUBLICATIONS

Chang et al., "Arsenic Dimer Implants for Shallow Extension in .13um Logic Devices", IEEE, pp. 111-114, 2002.*
Peter Kopalidis, Christina Sohl, Brian S. Freer, Michael Ameen, Ros Reece and Mark Rathmell; "Low Energy Implant Throughput Improvement by Using the Arsenic Dimer Ion (As2+) on the Axcelis GSDIII/LED Ion Implanter"; Conference on Ion Implantation Technology; Sep. 22-27, 2002.
Bill Chang, Johathan Chang, A. Agarwal, M.S. Ameen, R. N. Reece, H.I. Chen, Derrick Chien, C.C. Tsai, Mingsheng Tsai. C.L. Weng, D.Y. Wu and C.K. Yang; "Arsenic Dimer Implants for Shallow Extension in 0.13um Logic Devices"; Conference on Ion Implantation Technology, Sep. 22-27, 2002.

* cited by examiner

*Primary Examiner*—Carl Whitehead, Jr.
*Assistant Examiner*—Yennhu B Huynh
(74) *Attorney, Agent, or Firm*—Peter K. McLarty; W. James Brady, III; Frederick J. Telecky, Jr.

(57) ABSTRACT

The present invention provides, in one embodiment, a method of fabricating a semiconductor device (100). The method comprises exposing a portion (125) of an n-type substrate (105) to an arsenic dimer (130). The method also includes forming a p-type lightly doped drain (LDD) region (145) within the portion of the n-type substrate (125). Other embodiments advantageously incorporate the method into methods for making PMOS devices.

13 Claims, 8 Drawing Sheets

METHOD FOR FABRICATING A P-TYPE SHALLOW JUNCTION USING DIATOMIC ARSENIC

TECHNICAL FIELD OF THE INVENTION

The present invention is directed in general to the manufacture of a semiconductor devices, and, more specifically, to a method of fabricating a p-type shallow junction using diatomic arsenic as a pre-amorphization implant.

BACKGROUND OF THE INVENTION

The continuing push to produce faster semiconductor devices with lower power consumption has resulted in the miniaturization of semiconductor devices. With shrinking process geometries, comes a number of new design issues. For instance, reducing gate oxide thickness and channel width are conducive to the low voltage and faster operation of a field effect transistor (FET). Such smaller designed FETs, however, are more susceptible to leakage currents, or punch through, when the transistor is off.

One approach to reduce the leakage current is to form shallow source and drain regions immediately next to the gate. Such shallow junctions or lightly doped drain (LDD) regions, are near the substrate's surface and the channel region, acting as extensions to the more heavily doped source and drain region. It is desirable for a shallow junction to have a well-defined boundary, as exemplified by an abrupt decrease in dopant concentration, to support low-voltage operation of the FET and to define the width of the channel region. The efficient fabrication of transistors having shallow junctions with a well-defined boundary has been problematic, however.

Shallow junctions typically are formed by ion implantation of dopant species, followed by rapid or spike thermal annealing, to electrically activate the dopant. To establish n-type doped shallow junctions in a negative channel metal oxide semiconductor (NMOS) transistor, typical dopants include arsenic ($As^+$), or at low implantation energies, arsenic dimer ($As_2^+$). To establish p-type doped shallow junctions in a positive channel metal oxide semiconductor (PMOS) transistor, a typical dopant is boron ($B^+$). Low mass dopants, such as boron, however, are subject to undesired enhanced diffusion into the implantation-caused damaged lattice structure of silicon substrates during thermal annealing, known as transient enhanced diffusion (TED). TED is undesirable because it decreases the abruptness of the change in dopant concentration from the shallow junction to a p-well or n-well that the shallow junction is formed in. This, in turn, deters the formation of shallow junctions having suitably shallow depths (e.g., less than about 100 nm). TED can also cause dopants, such as boron, to diffuse in the channel region, thereby causing an unfavorable change in the doping concentration in the channel, an increase in electron trapping, a decrease in low-field hole mobility, and a degraded current drive. Although numerous procedures have been proposed to mitigate TED, each is problematic.

One such procedure involves forming a thermal oxide screen over the silicon substrate, and performing the boron implant through the screen. Forming a thermal oxide, such as silicon dioxide, however, significantly increases the thermal budget for transistor fabrication. Another proposal to mitigate TED is to perform low energy (e.g., ~5 keV or less) implants using higher mass dopant species, such as boron difluoride ($BF_2$). Many ion implantation tools, however, are not designed to perform low energy implantation. Accordingly, there are increased problems in controlling the uniformity of implantation of the dopant. Yet another way to reduce TED is to implant a heavier dopant, such as phosphorus, into the tips of the LDD nearest the channel so as to block the diffusion of boron into the channel region. Phosphorus, however, is also subject to TED, although to a lesser extent than boron.

Still another way to mitigate TED is to perform an implantation step of implant species that are electrically inactive elements, such as germanium. However, the high doses of germanium needed to amorphize the surface regions of the silicon substrate also damages regions deep within the silicon substrate, creating channels through which boron can diffuse during the thermal anneal. This undesirably results in a shallow junction having a diffuse boundary. Alternatively, low doses of antimony, an electrically active heavy atom (atomic mass unit (AMU) equal to about 122) can be used to localize the damage to surface regions of the substrate.

There are a number of unfavorable aspects in using antimony, however. For example, a gaseous source of antimony is not available. Because a solid source of antimony must be used, it is more difficult to control the flow of antimony into the ion implantation tool. This decreases the uniformity of antimony deposited. Moreover, antimony must be heated to a high temperature (~500° C.) to vaporize the material. Therefore, longer periods are required between implantation steps of different species using the implantation tool, resulting in a decrease in the rate of production of transistors. In addition, there is also an increase risk of implant species cross-contamination of the implantation tool, which may necessitate the dedication of an implant tool solely to antimony implantation, thereby increasing the total cost of transistor production. Furthermore, the lifetime of source and electrodes in the implantation tool used to implant antimony is shortened, due the increased coating and arcing caused by a tendency to over vaporize because of the difficulties in controlling the flow of antimony into the ion implantation tool.

Accordingly, what is needed in the art is an improved method of manufacturing shallow junctions in transistors that avoid the above-mentioned limitations.

SUMMARY OF THE INVENTION

To address the above-discussed deficiencies of the prior art, the present invention provides a method of fabricating a semiconductor device. The method comprises exposing a portion of an n-type substrate to an arsenic dimer and forming a p-type lightly doped drain (LDD) region within the portion of the n-type substrate.

In another embodiment, the present invention provides a method of manufacturing a positive channel metal oxide semiconductor (PMOS) transistor. The method includes forming an n-well in a semiconductor substrate and forming a p-type shallow junction in the n-well. Analogous to that described above, the p-type shallow junction is formed by implanting an arsenic dimer in a selected surface of the n-well and implanting a p-type dopant species in the selected surface. The semiconductor substrate is thermally annealed.

Yet another embodiment of the present invention is a PMOS device. The PMOS device includes an n-well in a silicon substrate and a p-type region located within the silicon substrate that includes arsenic. The arsenic within the p-type region has a maximum concentration at a depth of between about 1 and about 25 nanometers of a surface of the p-type region.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention recognizes the advantages of using an arsenic dimer as the species for pre-amorphization implant (PAI) to prepare the substrate for p-type shallow junction formation in a PMOS semiconductor device, such as a transistor. Because it has a higher mass (150 AMU) than antimony, the arsenic dimer can be implanted at similar or lower doses than antimony while still providing suitable amorphization of the silicon substrate, as indicated by the formation of the subsequently formed p-type shallow junction. Furthermore, the arsenic dimer is obtained from a gaseous precursor, and therefore the introduction of species for PAI into the ion implantation tool can be better controlled, leading to more uniform implantation of arsenic dimer into the semiconductor substrate than antimony. In addition, there is better utilization of the ion implantation tool because there is no need to under go a heating step to vaporize the species for PAI, as necessary when using antimony.

Figure 1A:
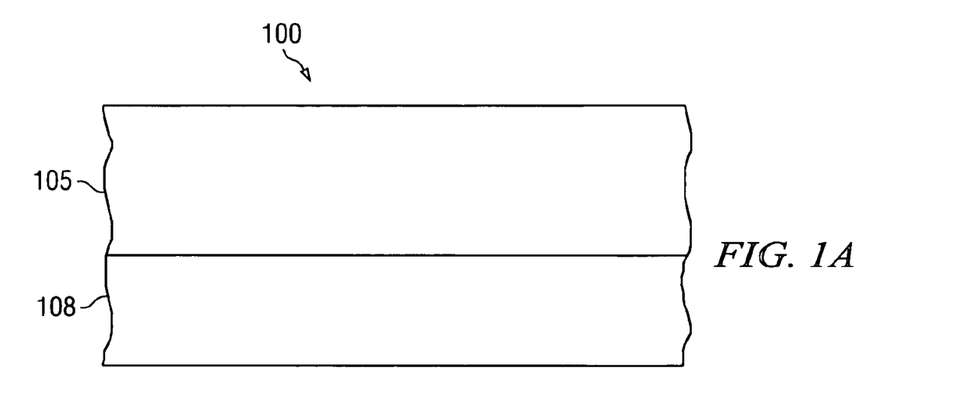
FIGS. 1A to 1F illustrate sectional views of selected steps in a method for fabricating a semiconductor device according to the principles of the present invention.
Figure 1B:
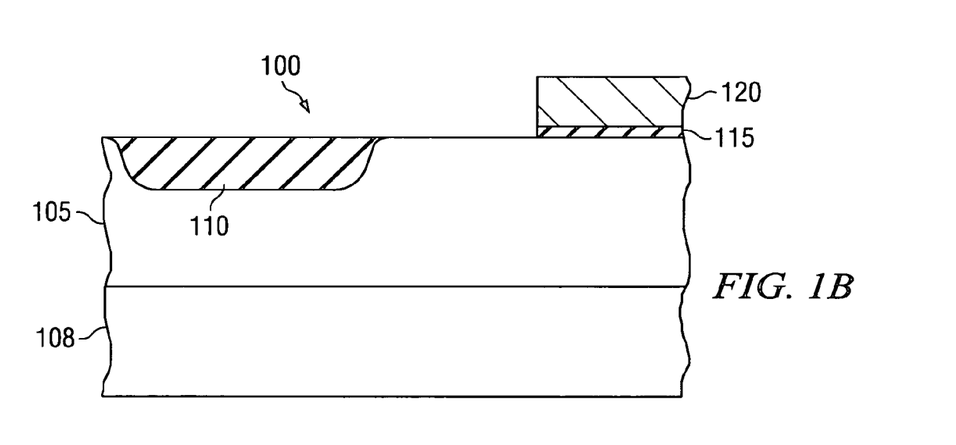

One embodiment of the present invention is illustrated in FIGS. 1A to 1F, which illustrate sectional views of selected steps, at various stages of manufacture, of a method for fabricating a semiconductor device 100 according to the principles of the present invention. FIG. 1A depicts a partial sectional view of a conventionally formed n-type semiconductor substrate 105, located over a semiconductor substrate 108, such as silicon. The n-type substrate 105 is preferably a silicon substrate doped with and an n-type dopant, such as arsenic ($As^+$) or phosphorus ($P^+$) using conventional procedures. As shown in FIG. 1B, a field oxide 110, gate oxide layer 115 (e.g., less than about 100 Angstroms) and gate 120 are formed over the n-type substrate 105, using conventional deposition and photolithography techniques.

Figure 1C:
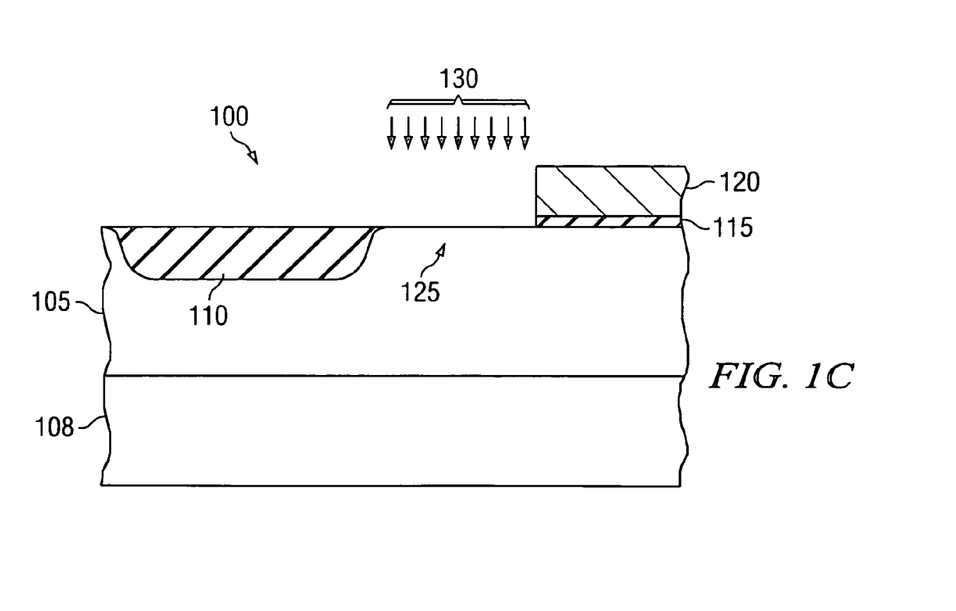

FIG. 1C depicts exposing a portion 125 of the n-type substrate 105 to an arsenic dimer 130. It is desirable for the field oxide 110 and gate 120, by acting as masks, to define the portion of the substrate 105 that is exposed to arsenic dimer 130. Preferably, exposure includes implanting the arsenic dimer using an arsenic dimer dose of between about $1 \times 10^{13}$ and about $6 \times 10^{13}$ atoms/cm$^2$, and more preferably about $3 \times 10^{13}$ and about $5 \times 10^{13}$ atoms/cm$^2$. Exposure also preferably includes applying the arsenic dimer at an acceleration energy of between about 20 and about 70 keV, and more preferably between about 35 and about 55 keV.

Figure 1D:
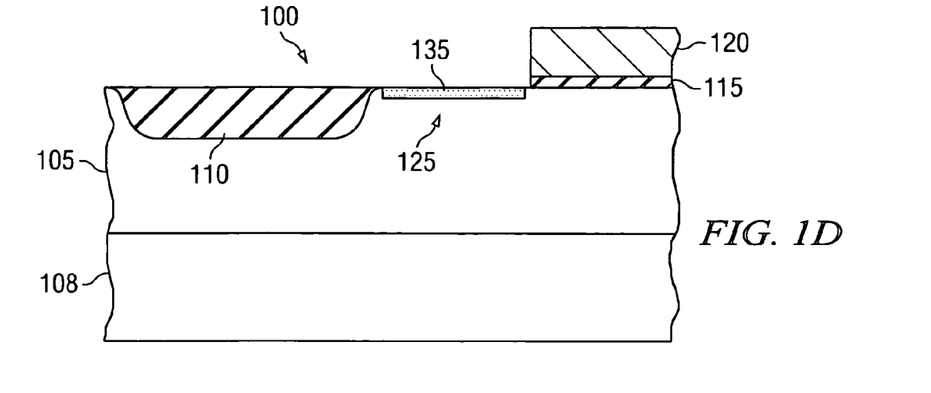

As shown in FIG. 1D, in preferred embodiments, exposure to the arsenic dimer 130 forms an amorphized surface 135 on the portion of the n-type substrate 125. As well understood by those skilled in the art, an amorphized surface 135 is one that has lost its crystallinity and become substantially disordered or amorphous. The extent of amorphization of the surface 135 can be assessed using conventional techniques, such as measuring the fractional change in sample reflectivity resulting from the surface's responses to a pump laser, as further illustrated in the experimental section to follow. For example, in preferred embodiments, exposure to arsenic dimer 130 forms an amorphized surface 135 so as to produce a thermawave signal of greater than about 1000 thermawave units, and more preferably greater than about 1200 thermawave units.

Figure 1E:
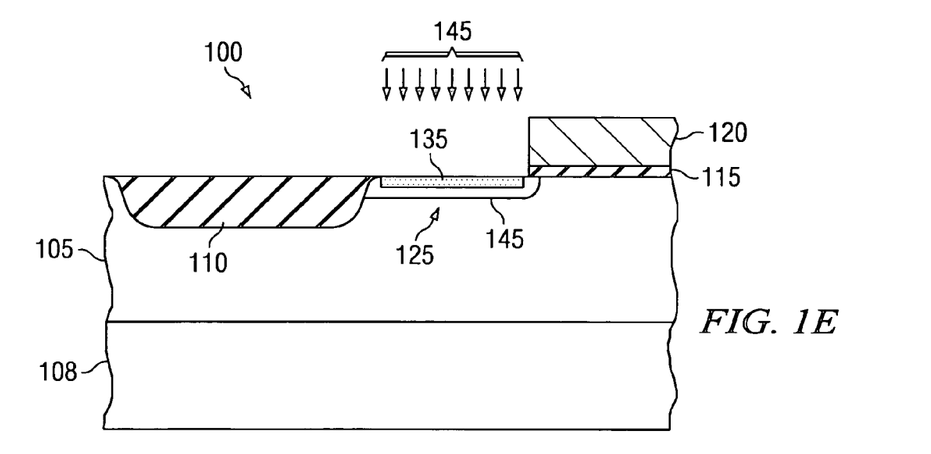

FIG. 1E depicts forming a p-type lightly doped drain (LDD) region 145 within the portion of the n-type substrate 125. In certain preferred embodiments, forming the p-type LDD region 145 includes implanting a p-type dopant 140, such as boron into the portion of the n-type substrate 125 to form the LDD region 145. The amorphized surface 135 produced by the above-described PAI process is thought to impede the diffusion of the implanted p-type dopant 140. This, in turn, facilitates the formation of a well-defined LDD region 145, as further discussed below.

In certain preferred embodiments, forming the p-type LDD region 145 includes implanting a p-type dopant 140, at a dose of between about $1 \times 10^{14}$ and about $3 \times 10^{15}$ atoms/cm$^2$, and more preferably between about $3 \times 10^{14}$ and about $1 \times 10^{15}$ atoms/cm$^2$. In other preferred embodiments, forming the p-type LDD region 145 includes implanting the p-type dopant 140, at an acceleration energy of between about 1 and about 30 keV, and more preferably between about 3 and about 8 keV.

Figure 1F:
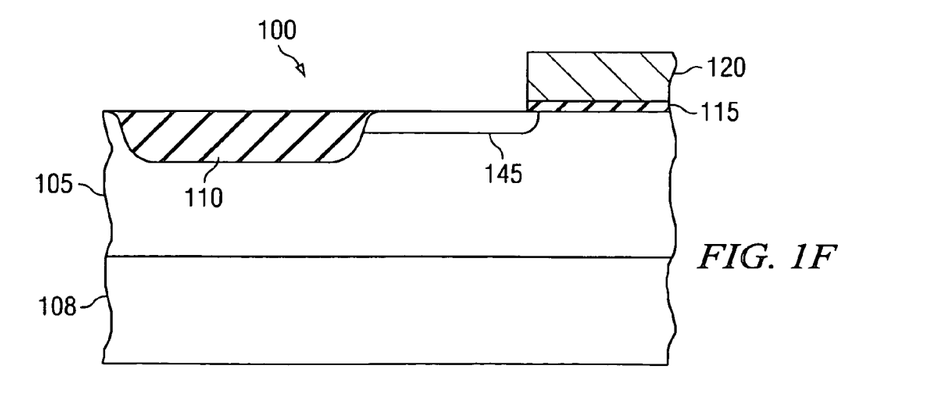

FIG. 1F illustrates the semiconductor device 100 after performing a thermal anneal to repair the amorphized surface 135 and diffuse p-type dopant 140 into the n-type substrate 105. In preferred embodiments, the thermal anneal comprises heating to a temperature of between about 700 and about 1200° C. for between about 2 and about 60 seconds. More preferably, the thermal anneal includes heating to a temperature of between about 950 and about 1050°

C. for between about 1.5 and about 20 seconds. In other preferred embodiments the thermal anneal comprises a spike anneal comprising the application of similar temperature ranges for between about 1 and about 3 seconds.

Figure 2A:
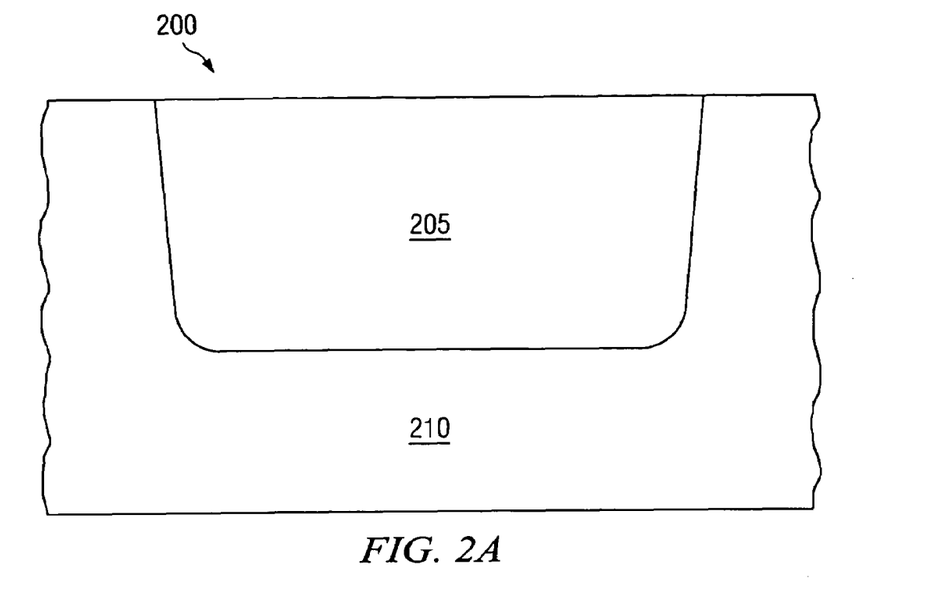
FIGS. 2A to 2D illustrate sectional views of selected steps in a method of manufacturing a PMOS transistor according to the principles of the present invention.
Figure 2B:
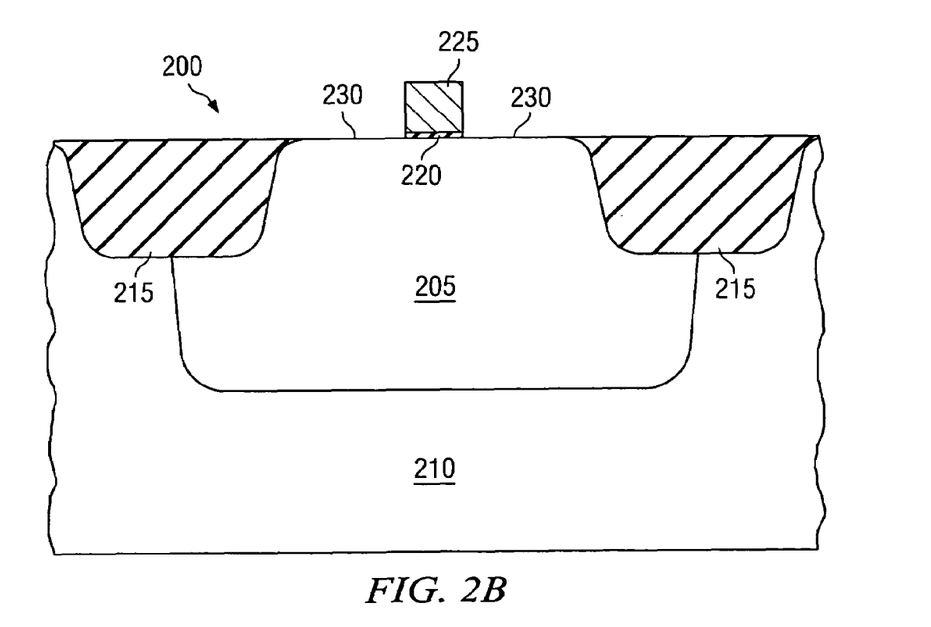
Figure 2C:
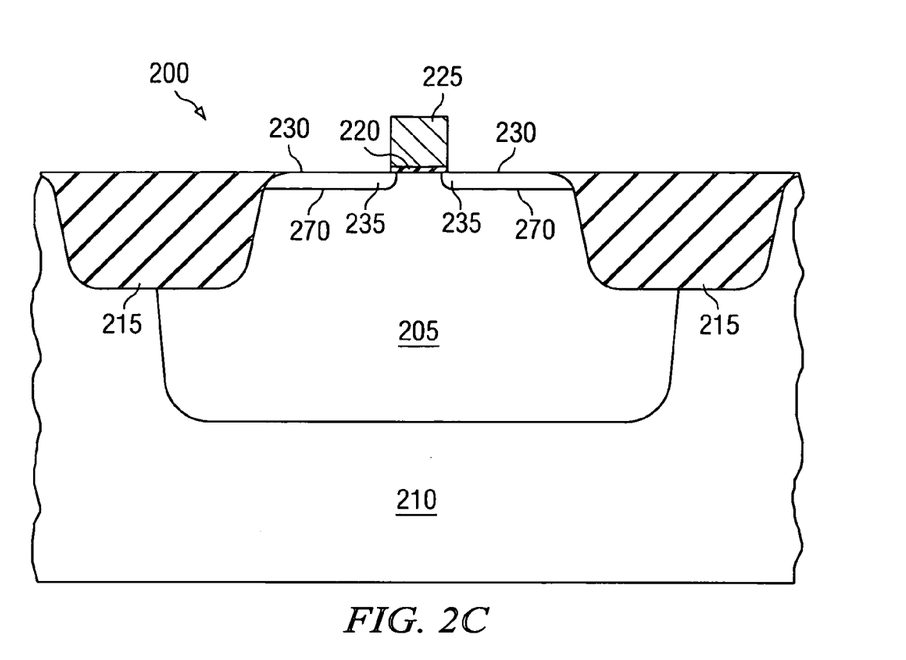
Figure 2D:
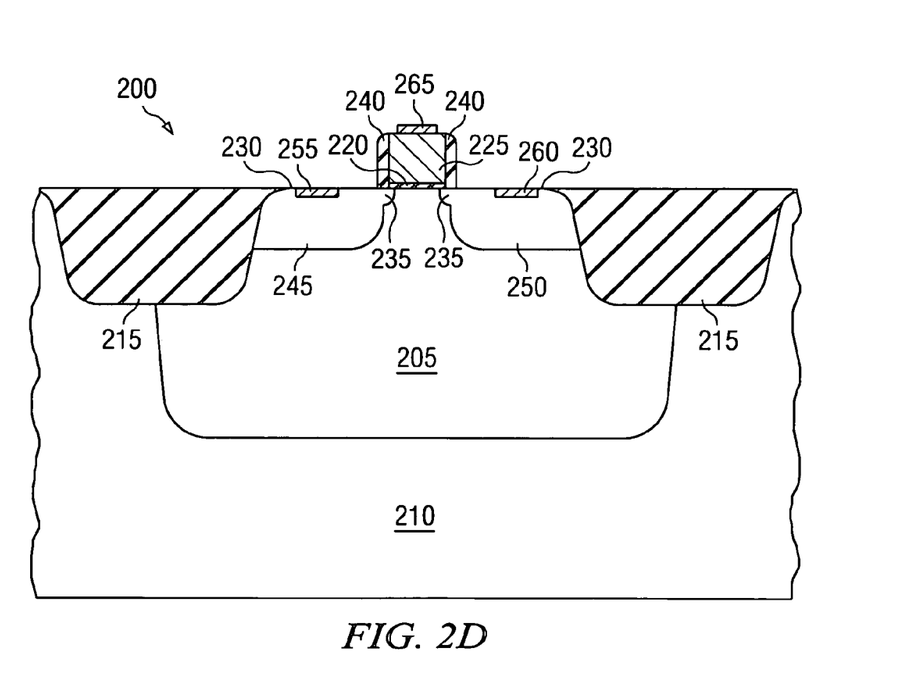

Another embodiment of the present invention is illustrated in FIGS. 2A to 2D, a method of manufacturing a positive channel metal oxide semiconductor (PMOS) transistor 200. Turning initially to FIG. 2A, the method includes forming an n-well 205 in a semiconductor substrate 210 using conventional procedures similar to that described above. A field oxide 215, gate oxide 220 and gate 225 can be formed using conventional techniques, to define a selected surface of the n-well 230, shown in FIG. 2B. Turning to FIG. 2C, the method also includes forming a p-type shallow junction 235 in the n-well 205, using the above-described arsenic dimer and p-type dopant implantation processes in the selected surface 230, and thermal annealing processes. In FIG. 2D, the method further includes forming spacer sidewalls 240, source and drain regions 245, 250, and contacts 255, 260, 265, using conventional procedures.

Because the PAI is performed using arsenic dimer, the p-type shallow junction 235 includes an arsenic dopant. In some embodiments, the shallow junction 235 has a maximum arsenic dopant concentration at a depth of between about 1 and about 25 nanometers, and more preferably between about 10 nanometers and about 25 nanometers, from the selected surface 230. In certain preferred embodiments, the maximum arsenic dopant concentration is between about $2 \times 10^{19}$ and about $1 \times 10^{18}$ atom/cm$^3$, and more preferably, between about $1.2 \times 10^{19}$ and about $8 \times 10^{18}$ atom/cm$^3$.

It is advantageous for the p-type shallow junction 235 to form a well-defined boundary of p-type dopant 270 (FIG. 3C), such as boron, within the n-well 205 because this facilitates the low-voltage operation of the transistor 200. In certain preferred embodiments, the p-type shallow junction 235 has a gradient of p-type dopant concentration equal to greater than about $2.5 \times 10^{17}$, and more preferably, greater than about $7.5 \times 10^{17}$ atoms/cm$^3$ per nanometer. In other embodiments, the p-type dopant has a concentration at the boundary 270, of less than about about $1 \times 10^{17}$ atom/cm$^3$, and more preferably less than about $1 \times 10^{16}$ atom/cm$^3$. In certain preferred embodiments, however, the boundary 270 is at a depth 275 of less than about 30 nanometers, and more preferably, less than about 25 nanometers, from the selected surface 230.

Figure 3A:
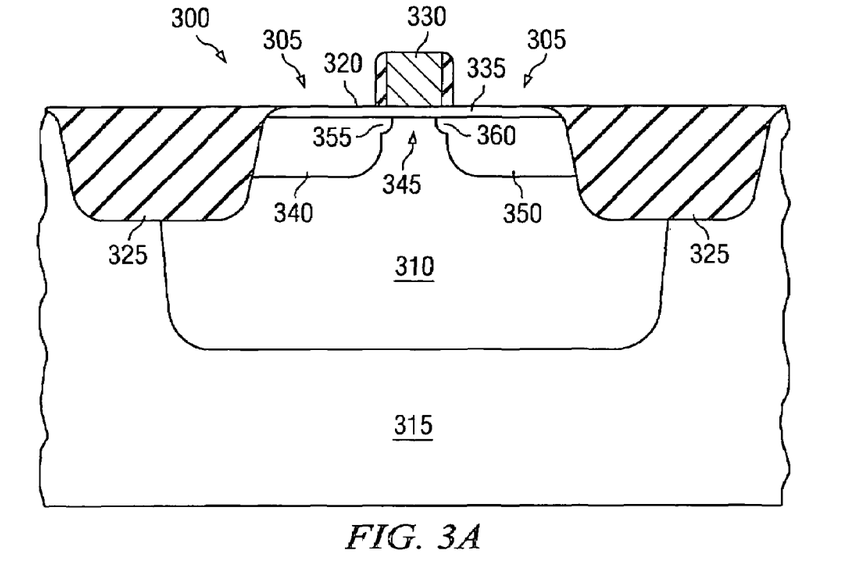
FIGS. 3A and 3B illustrates sectional views of a PMOS device of the present invention.
Figure 3B:
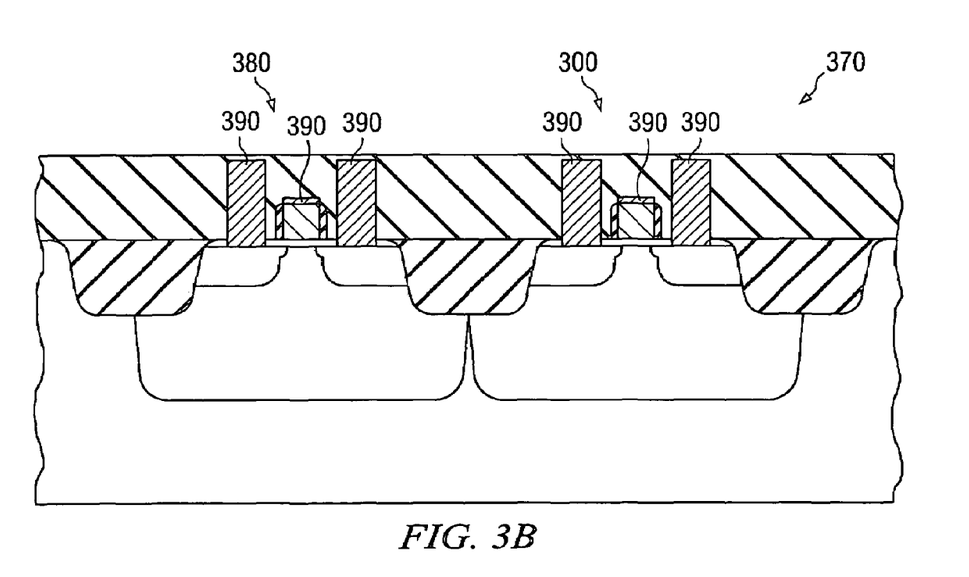

FIGS. 3A and 3B illustrate another aspect of the present invention, a positive channel metal oxide semiconductor (PMOS) device 300. Any of the above-described embodiments of the methods for fabricating a p-type shallow junction or LDD region may be used to fabricate a p-type region 305 of the PMOS device 300 (FIG. 3A). The PMOS device 300 further comprises an n-well 310 located in a silicon substrate 315 and the p-type region 305 is located within the silicon substrate 315. The p-type region 305 includes arsenic having a maximum concentration at a depth of between about 1 and about 25 nanometers of a surface 320 of the p-type region 305.

In preferred embodiments, the PMOS transistor 300 includes a field oxide 325, gate 330, a gate oxide 335 and the p-type region 305 is a source and a drain region 340, 345 having a p-channel region 350 located there between, and the gate 330 is located over the p-channel region 350. In preferred embodiments, source and drain regions 340, 345 each include a lightly doped region 355, 360. It should be noted that while the metal levels and corresponding interconnects are not shown, those who are skilled in the art understand how to complete such devices.

As further illustrated in FIG. 3B, in certain preferred embodiments, the PMOS transistor 300 is a component in a complementary metal oxide semiconductor (CMOS) transistor 370, that further includes a conventionally constructed NMOS transistor 380 and suitable interconnect metal structures 390 to form an active device. While metal levels and interconnects are are not shown, those skilled in the art understand how to complete such devices.

Having described the present invention, it is believed that the same will become even more apparent by reference to the following experiments. It will be appreciated that the experiments are presented solely for the purpose of illustration and should not be construed as limiting the invention. For example, although the experiments described below may be carried out in a laboratory setting, one skilled in the art could adjust specific numbers, dimensions and quantities up to appropriate values for a full-scale production plant setting.

EXPERIMENTAL RESULTS

Experiments were conducted to compare the use of arsenic dimer versus antimony as the ion source for pre-amorphization implantation. PAI with antimony or arsenic dimer ($As_2^+$), and the subsequent implantation with p-type dopant, and rapid thermal annealing, and subsequent secondary ion mass (SIM) spectroscopy measurements were conducted using commercial instruments. Solid antimony was vaporized at about 500° C. to provide the PAI species for antimony. $AsH_3$ gas was used to provide the PAI species for arsenic dimer, respectively. The magnetic field of the ion implantation tool was adjusted such that the ion beam predominantly contained arsenic dimer. $BF_2$ was used as the ion source for the p-type dopant.

Figure 4:
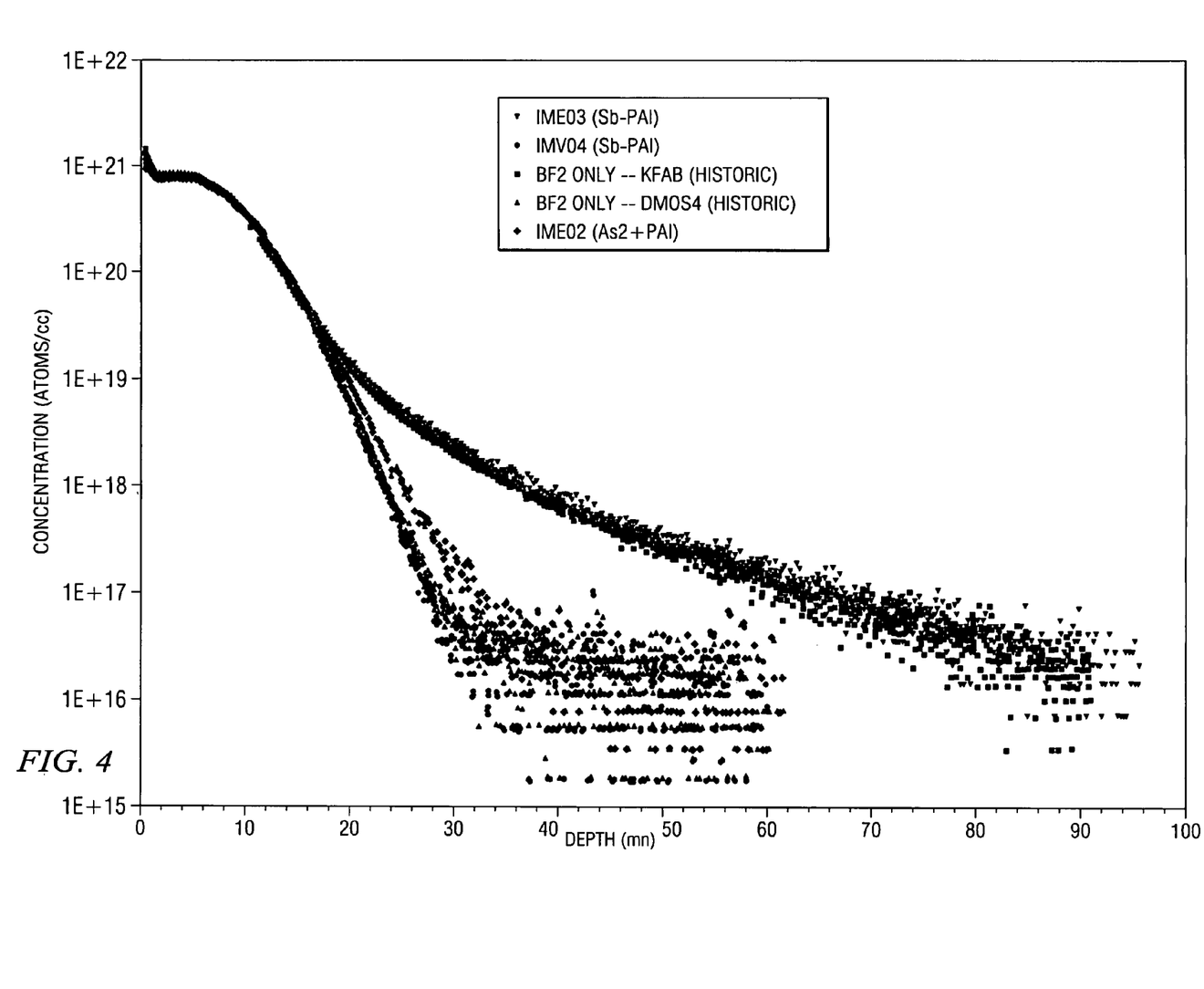
FIG. 4 presents exemplary secondary ion mass spectroscopy (SIMS) profiles comparing boron implantation into test wafers having pre-amorphization implants of antimony versus arsenic dimer.

FIG. 4 shows exemplary SIMS profiles of boron concentration as a function of depth into test silicon wafers. Antimony was implanted into test silicon wafers using a dose of about $1.5 \times 10^{13}$ atoms/cm$^2$ and acceleration energy of about 30 keV. Arsenic dimer was implanted into other test wafers using a dose of about $1.5 \times 10^{13}$ atoms/cm$^2$ and acceleration energy of about 48 keV. $BF_2$ was then implanted into the test wafers using a dose of about $8 \times 10^{14}$ atoms/cm$^2$ and acceleration energy of about 5 keV. The test wafers were then thermally annealed by heating to about 900° C. for about 20 seconds. The exemplary data illustrates that similar boron profiles are obtained when either antimony or arsenic dimer are used for the PAI.

For comparative purposes, FIG. 4 also depicts typical boron SIMS profiles produced under similar conditions except that no PAI was performed ("BF2 only"). The BF2 only SIMS profiles indicate substantial tailing of boron, with a shallow decreasing gradient in boron concentration, to depths of at least about 100 nm into the test wafer, indicative of a poorly define boundary. In contrast, the SIMS profile of the test wafer using arsenic dimer for the PAI had a well defined boundary with a steep change in boron concentration (about $2.5 \times 10^{17}$ to greater than about $7.5 \times 10^{17}$ atoms/cm$^3$ per nanometer) up to depths of about 25 to 30 nanometers. Thereafter, the boron concentration was less than about $1 \times 10^{17}$ atom/cm$^3$ to less than about $1 \times 10^{16}$ atom/cm$^3$.

Figure 5A:
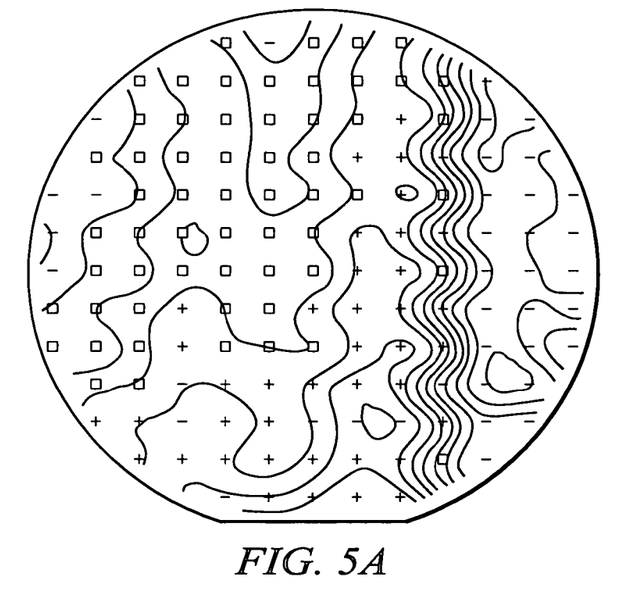
FIG. 5 presents exemplary data comparing the amorphization test wafer surfaces using pre-amorphization implant treatments of antimony versus arsenic dimer.
Figure 5B:
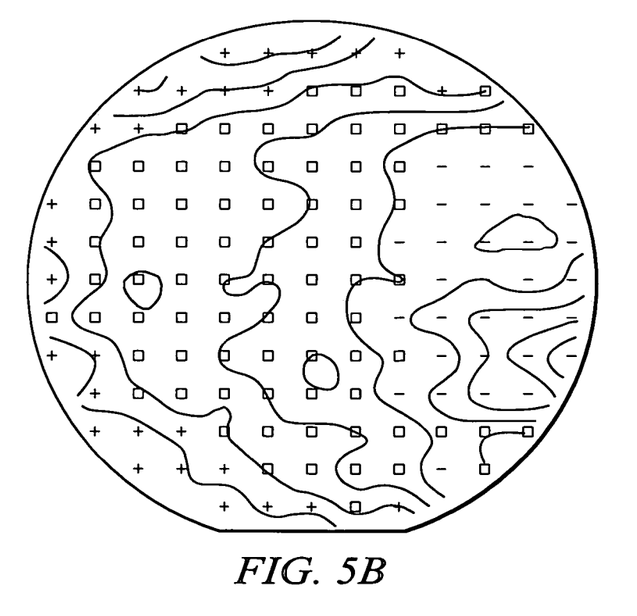

FIG. 5 presents exemplary data comparing the amorphization of the surface test silicon wafers having an oxide film grown thereon, using antimony versus arsenic dimer for PAI (Sb PAI and $As_2^+$ PAI, respectively) . The PAI was performed using similar conditions to that described above. The amorphization of the test wafers was measured by measuring the fractional change in sample reflectivity resulting from the test wafer surface's response to a modulated pump laser, using a Therma-Probe™ (Therma-Wave, Inc., San Francisco Calif.). The fractional change in reflectivity, a dimensionless parameter, is commonly referred to as a thermawave (TW) signal by those skilled in the art. The higher the TW signal, the greater the degree of amorphization of the surface. As indicated in FIG. 5 the extent of amorphization of the test wafer subject to Sb PAI had an average TW signal of 1227±6 (range: 1214 to 1240). The extent of amorphization of the test wafer using $As_2^+$ PAI was substantially the same having an average TW signal of 1234±4 (range: 1224 to 1243).

Figure 6:
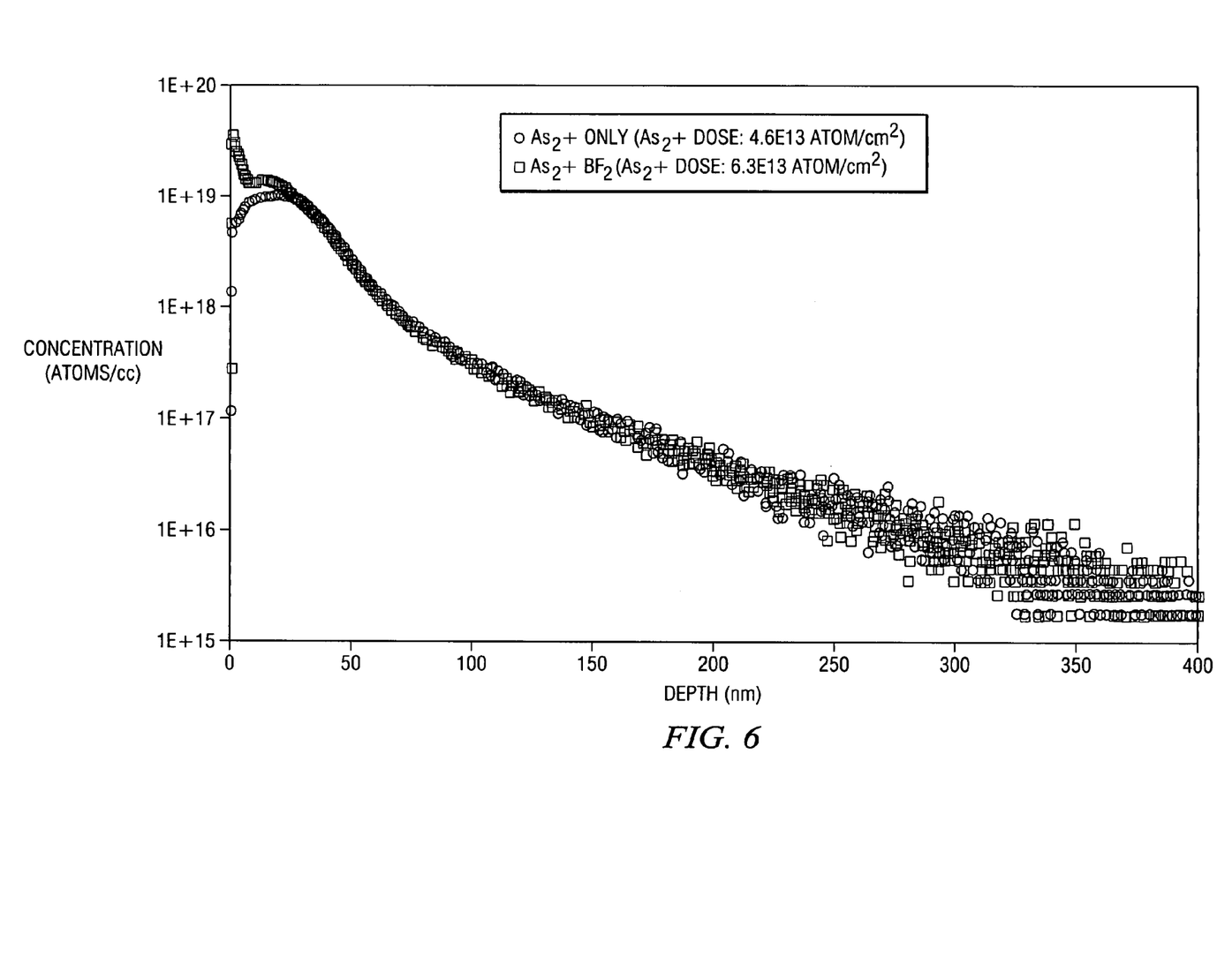
FIG. 6 presents exemplary SIM spectroscopy profiles of arsenic implantation into test wafers having pre-amphorization implants of arsenic dimer.

FIG. 6 presents exemplary SIMS profiles of arsenic implantation into test wafers having a PAI using arsenic dimer. The PAI of the test wafers were performed using similar conditions as described above. Exemplary profiles are shown for a test wafer implanted with arsenic dimer only ("$As_2^+$ only") and for a test wafer implanted with arsenic dimer followed by boron implantation under condition similar to that described above ("$As_2^+ + BF_2$"). The maximum arsenic dopant concentration (greater than about $9 \times 10^{18}$ atoms/cm$^3$) for $As_2^+$ occurred at a depth of between about 10 nanometers and about 30 nanometers, with a peak of about $1 \times 10^{19}$ atoms/cm$^3$ at between about 18 and about 22 nanometers. For $As_2^+ + BF_2$ the maximum arsenic dopant concentration (greater than about $2 \times 10^{19}$ atoms/cm$^3$) occurred at a depth of between about 1.3 nanometers and about 3.8 nanometers, with a peak of about $3 \times 10^{19}$ atoms/cm$^3$ at between about 1.7 and about 2.1 nanometers.

Although the present invention has been described in detail, one of ordinary skill in the art should understand that they can make various changes, substitutions and alterations herein without departing from the scope of the invention.

What is claimed is:

1. A method of fabricating a PMOS semiconductor device, comprising:
   forming an amorphized surface on a portion of an n-type substrate by exposing said surface to an arsenic dimer; and
   forming a p-type lightly doped drain (LDD) region within said amorphized surface of said n-type substrate.

2. The method as recited in claim 1, wherein said exposing includes implanting said an arsenic dimer using an arsenic dimer dose of between about $1 \times 10^{13}$ and about $6 \times 10^{13}$ atoms/cm$^2$.

3. The method as recited in claim 1, wherein said exposing includes applying said arsenic dimer at an acceleration energy of between about 20 and about 70 keV.

4. The method as recited in claim 1, wherein forming said p-type region includes implanting a p-type dopant species of boron into said LDD region.

5. The method as recited in claim 1, wherein forming said p-type lightly doped region includes implanting a p-type dopant species at a dose of between about $1 \times 10^{14}$ and about $3 \times 10^{15}$ atoms/cm$^2$.

6. The method as recited in claim 1, wherein forming said p-type lightly doped region includes implanting a p-type dopant at an acceleration energy of between about 1 and about 30 keV.

7. The method as recited in claim 1, further including a thermal anneal comprising heating to a temperature of between about 700 and about 1200° C. for between about 1 and about 30 seconds.

8. A method of manufacturing a positive channel metal oxide semiconductor (PMOS) transistor, comprising:
   forming an n-well in a semiconductor substrate; and
   forming a p-type shallow junction in said n-well including:
      implanting an arsenic dimer in a selected surface of said n-well to form an amorphous region in said selected surface; and
      implanting a p-type dopant species in said amorphous region of selected surface; and
   thermally annealing said semiconductor substrate.

9. The method recited in claim 8, wherein said p-type shallow junction includes a maximum arsenic dopant concentration at a depth of between about 1 and about 25 nanometers of said selected surface.

10. The method recited in claim 9, wherein said maximum arsenic dopant concentration is between about $1 \times 10^{19}$ and about $1 \times 10^{18}$ atom/cm$^3$.

11. The method recited in claim 8, wherein said p-type shallow junction includes a p-type dopant gradient equal to greater than about $2.5 \times 10^{17}$ atoms/cm$^3$ per nanometer.

12. The method recited in claim 8, wherein forming said p-type shallow junction includes forming a boundary within said n-well, wherein said boundary has a dopant concentration of less than about $1 \times 10^{17}$ atom/cm$^3$.

13. The method recited in claim 12, wherein said boundary is at a depth of less than about 30 nanometers from said selected surface.

* * * * *